United States Patent [19]

Van Doorn et al.

[11] Patent Number: 4,468,661

[45] Date of Patent: Aug. 28, 1984

[54] MATRIX EXCITATION CIRCUIT FOR AN OSCILLOSCOPE DISPLAY SCREEN COMPRISING A LIQUID CRYSTAL

[75] Inventors: Cornelis Z. Van Doorn; Jean H. J. Lorteije, both of Eindhoven, Netherlands

[73] Assignee: U.S. Philips Corporation, New York, N.Y.

[21] Appl. No.: 71,828

[22] Filed: Sep. 4, 1979

[30] Foreign Application Priority Data

Sep. 6, 1978 [NL] Netherlands ............... 7809081

[51] Int. Cl.$^3$ .................................. G09G 3/36
[52] U.S. Cl. ........................... 340/784; 324/96; 340/754; 350/333
[58] Field of Search ............ 340/784, 753, 754

[56] References Cited

U.S. PATENT DOCUMENTS

| 3,938,134 | 2/1976 | Hackstein et al. | 340/784 |
| 3,938,136 | 2/1976 | Kawakami | 340/784 |
| 3,955,187 | 5/1976 | Bigelow | 340/784 |
| 4,044,345 | 8/1977 | Ueda et al. | 340/784 |
| 4,127,848 | 11/1978 | Shanks | 350/333 X |
| 4,180,813 | 12/1979 | Yoneda | 340/784 |

Primary Examiner—David L. Trafton
Attorney, Agent, or Firm—Paul R. Miller

[57] ABSTRACT

For the display of a phenomenon or a small number of phenomena by means of an oscilloscope comprising a liquid crystal display screen, a simple matrix excitation circuit is described wherein a time-division multiplex excitation with a great number of lines and a good contrast appears possible if for each column only one or a few picture elements must be set to the ON-state, costly provisions such as voltage and temperature stabilization being required.

15 Claims, 6 Drawing Figures

MATRIX EXCITATION CIRCUIT FOR AN OSCILLOSCOPE DISPLAY SCREEN COMPRISING A LIQUID CRYSTAL

The present invention relates to a matrix excitation circuit for an oscilloscope display screen comprising a liquid crystal.

Matrix excitation circuits are frequently used for displaying line-shaped figures on a display screen which requires large numbers of rows and columns for obtaining an adequate resolution, for example more than a hundred each.

Furthermore the invention relates to an oscilloscope comprising a matrix excitation circuit according to the invention.

A matrix excitation circuit is disclosed in the article by Alt and Pleshko, IEEE Transactions on Electron Devices, ED-21, 147 (1974).

Herein all display elements corresponding to points of intersection of rows and columns can be excited independently without the necessity of a separate excitation circuit for each display element. The above cited article shows that the attainable contrast reduces rapidly when the number of lines to be excited in time-division multiplex becomes too large, which is evident from the formula for the ratio of the root-mean-square (RMS) values of the voltages on the elements in the ON and OFF state, respectively;

$$\frac{\hat{V}_{on}}{\hat{V}_{off}} = \sqrt{\frac{\sqrt{n}+1}{\sqrt{n}-1}}$$

wherein n is the number of excited lines owing to this reduction in contrast it is not possible, without special measures, to excite more than approximately five lines, the ratio of the RMS values being approximately 1.6.

It is indeed possible to increase this number to 100 or more by using a two-frequency drive, but this causes a number of other drawbacks, such as the necessity of using properly stabilized supply voltages and ambient temperature. In addition, the energy consumption is increased.

It is an object of the invention to provide a matrix excitation circuit for a display screen having a large number of display elements for displaying oscilloscope pictures, such as line-shaped figures having an adequate resolution and contrast without the need for expensive measures.

According to the present invention there is provided a matrix excitation circuit for an oscilloscope display screen comprising a liquid crystal of the root-mean-square type, the display screen being provided at one side with a plurality of line-shaped first excitation electrodes and at the other side with a plurality of line-shaped second excitation electrodes crossing the first excitation electrodes and a portion of the liquid crystal located between two crossing electrodes forming a display element, the matrix excitation circuit comprising a row selection circuit for sequentially and repeatedly exciting the first excitation electrodes and a column excitation circuit for displaying a picture element by means of a display element, the column excitation circuit serving to apply a number of column excitation pulses to the second excitation electrodes corresponding to this display element, always simultaneously or substantially simultaneously with the row selection pulses applied by the row selection circuit to the first excitation electrode corresponding to this display element.

In many cases the column excitation pulses and the row selection pulses will have the same polarity, so that the voltage across a display element in the ON-state is zero or at least much lower than the RMS voltage across an element in the OFF-state. Depending on the display by means of a liquid crystal having crossed or parallel light polarizers, in reflection or in transmission, with bright picture elements on a dark background or vice versa and on the crystal type used it may be desirable that $\hat{V}_{on} > \hat{V}_{off}$, $\hat{V}$ indicating the root-mean-square value of a voltage.

In an embodiment of a matrix excitation circuit in accordance with the invention the column excitation pulses and the row selection pulses have the same amplitude and an opposite polarity.

For displaying time-dependent phenomena on an oscilloscope display screen the time scale will generally not correspond to the time sequence of excitation desired for the display.

This problem is overcome in another embodiment, in which the excitation circuit comprises a buffer store for storing the information to be displayed, address inputs whereof are coupled to outputs of the row selection circuit for reading the information in synchronism with the row selection, and read outputs whereof are coupled to the column excitation circuit for generating column excitation pulses.

A so-called dual or multi-channel oscilloscope is usually desired. A further advantageous embodiment is therefore characterized in that the buffer store comprises at least two storage locations per column for simultaneously displaying at least two phenomena on the oscilloscope display screen.

Various different embodiments of the present invention with all the embodiments having in common that use is made of the fact that, on the display of line-shaped pictures, only a small number of display elements per column is driven to the ON-state, the picture being scanned line-by-line ("vertical") instead of column-by-column ("horizontal"). In a display having n lines L and k columns K, the lines correspond to, for example, the amplitude of a signal to be displayed and the columns to a time scale associated with this signal. The lines are sequentially scanned in a period T with pulses having a length T/n and a voltage V. When certain display elements, for example on the points of intersection of lines i and columns j and k must be brought to the ON-state a pulse is applied, simultaneously with the pulse on line i, to the columns j and k with the same time duration and either a voltage V or a voltage −V.

During a period of time T the OFF-elements are supplied twice with a pulse having an amplitude V and the ON-elements with a voltage O in the first case and once with a pulse having a voltage 2V in the second case.

In the first case the mean square of the voltages is $$\overline{V_{on}^2} = 0 \text{ and } \overline{V_{off}^2} = \frac{2}{n} \cdot V^2,$$

so that the ON-voltage and the OFF-voltage of the electro-optical effect to be used may have any arbitrary ratio and V is chosen so that the OFF-voltage is lower than $V \cdot \sqrt{2/n}$.

In the second case the mean square of the voltage is $$\overline{V_{on}^2} = \frac{1}{n}(2V)^2 = \frac{4}{n} \cdot V^2 \text{ and } \overline{V_{off}^2} = \frac{2}{n} \cdot V^2.$$

Now $$\frac{\hat{V}_{on}}{\hat{V}_{off}}$$

becomes equal to $\sqrt{2}$ and the electro-optical effect to be used must have the same or smaller ON/OFF voltage in order to be suitable for use. This is inter alia the case with twisted nematic crystals.

When p elements of a column must be excited for displaying, for example, two line-shaped images or a Lissajoux figure, all the ON and OFF elements are then supplied with p−1 additional pulses having a voltage $|V|$.

In the first case we get the situation that $$\overline{V_{on}^2} = \frac{0 + (p-1)}{n} \cdot V^2 = \frac{p-1}{n} \cdot V^2$$

$$\overline{V_{off}^2} = \frac{2 + (p-1)}{n} \cdot V^2 = \frac{p+1}{n} \cdot V^2 \text{ and so:}$$

$$\frac{\hat{V}_{on}}{\hat{V}_{off}} = \sqrt{\frac{p-1}{p+1}}.$$

Assuming that a ratio approximately 1:1.6 yields a sufficient contrast, see the article cited above, values of p=1, 2 or 3 are still suitable without the necessity of additional special measures.

In the second case we get in an analog manner:

$$\overline{V_{on}^2} = \frac{p+3}{N} \cdot V^2 \text{ and } \overline{V_{off}^2} = \frac{p+1}{n} \cdot V^2$$

where:

$$\frac{\hat{V}_{on}}{\hat{V}_{off}} = \sqrt{\frac{p+3}{p+1}}$$

so that with p=2 a ratio of approximately 1:1.3 is achieved which is still just usable.

The present invention will now be described, by way of example, with reference to the accompanying drawing wherein.

Figure 1:
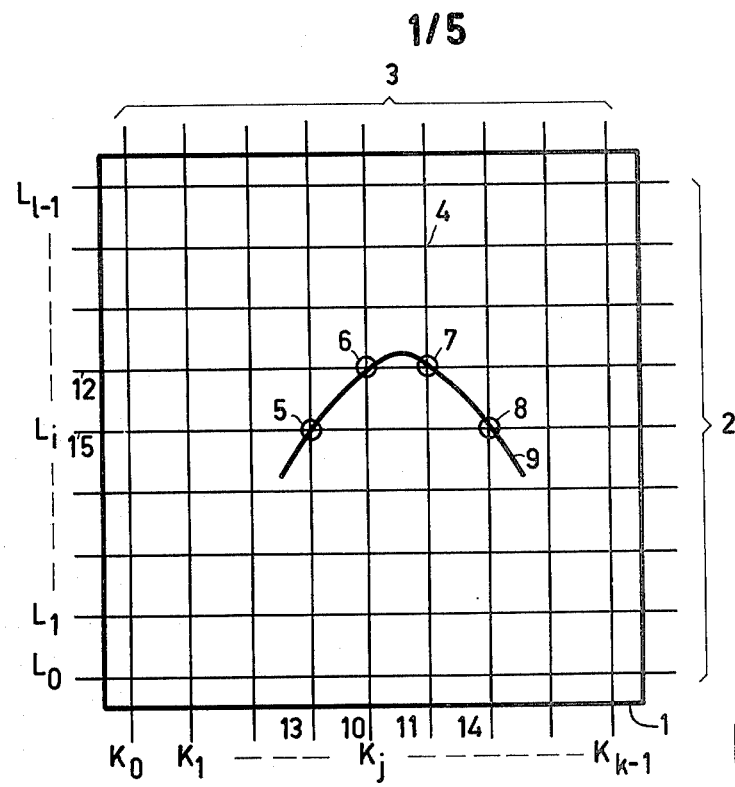
FIG. 1 shows a simplified diagram of a display screen.

FIG. 1 shows schematically a display screen 1 having 1 lines $L_o$ to $L_{l-1}$, inclusive, as the (horizontal) first excitation electrodes 2 and k columns $K_o$ to $K_{k-1}$, inclusive, as the (vertical) second excitation electrodes 3.

The points of intersection 4 represent display elements i, j, the elements 5, 6, 7 and 8 being encircled to indicate that, for example, these elements must be brought to an ON-condition to illustrate an approximation of a curve 9.

The first excitation electrodes L are excited one at a time in a cyclic sequence by a row-selection circuit, not shown, whereas a column excitation circuit, also not shown, excites the columns 10, 11 simultaneously with the excitation of row 12, and the columns 13, 14 simultaneously with row 15.

Figure 2:
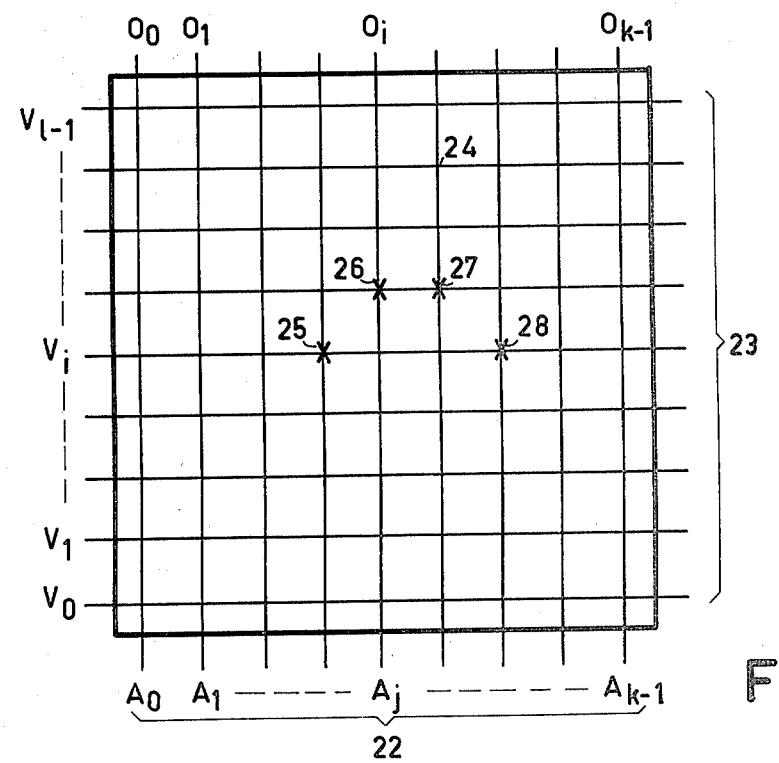
FIG. 2 shows a matrix-type picture of the contents of a simple buffer store.

FIG. 2 shows a simple buffer store 21 which is of the same matrix structure as the display screen having k address inputs 22, $A_o$ to $A_{k-1}$, inclusive, and 1 bit lines 23, $V_o$ to $V_{l-1}$, inclusive, in which store an "1" can be entered at any arbitrary bit position 24 by the simultaneous excitation of the address input and bit line associated with this bit position. This can, for example, be effected by periodically scanning a phenomenon to be displayed and encoding the amplitudes found therein with an analog-to-digital conversion to 1 outputs so that the excitation of an output of a higher number corresponds to a higher amplitude and excitation of an output having a lower number corresponds to a lower amplitude. When the first sample is taken the address input $A_o$ is excited simultaneously, when the second sample is taken etc. In this example an "1" is produced in this manner in the bit locations 25, 26, 27 and 28, while the other bit locations are "0".

For the display of a pattern on the display screen the bit lines $V_o$ to $V_{l-1}$, inclusive, are sequentially excited, simultaneously with the excitation of the rows $L_o$ to $L_{l-1}$, inclusive, respectively, an "1" voltage appearing for each "1" bit location of a bit line on the reading lines $O_o$ to $O_{k-1}$ inclusive. By coupling the outputs $O_j$ to the corresponding columns $K_j$ the desired picture is then produced on the display screen.

For the second case mentioned above where $\hat{V}_{on} > \hat{V}_{off}$ a type of buffer store may be chosen, if so desired, having read lines $O'_o$ to $O_{k-1}'$ inclusive, on which a "0" voltage appears for each "1" bit location of a bit line. It is, of course, alternatively possible to enter a "0" into the buffer store for any desired picture element and an "1" for all the remaining locations.

Before a new sample is taken the whole buffer store is cleared by adjusting all bit locations to the "OFF" condition.

Generally the read period will be of a different duration than the sampling period.

The control logic required for this simple example can be easily designed by one skilled in the art. The actual implementation will be one chosen out of a plurality of possible variations. However, these possibilities all have in common that a great number of gate circuits is required and especially a great number of connections to the buffer store.

Preferably, however, use will be made of a different type of buffer store having considerably fewer address inputs, write inputs or read outputs. Two examples of circuits made in accordance with the present invention will be described in detail here below. In working out details of the circuits a choice can be made, from a large number of variations which are known per se.

Figure 3:
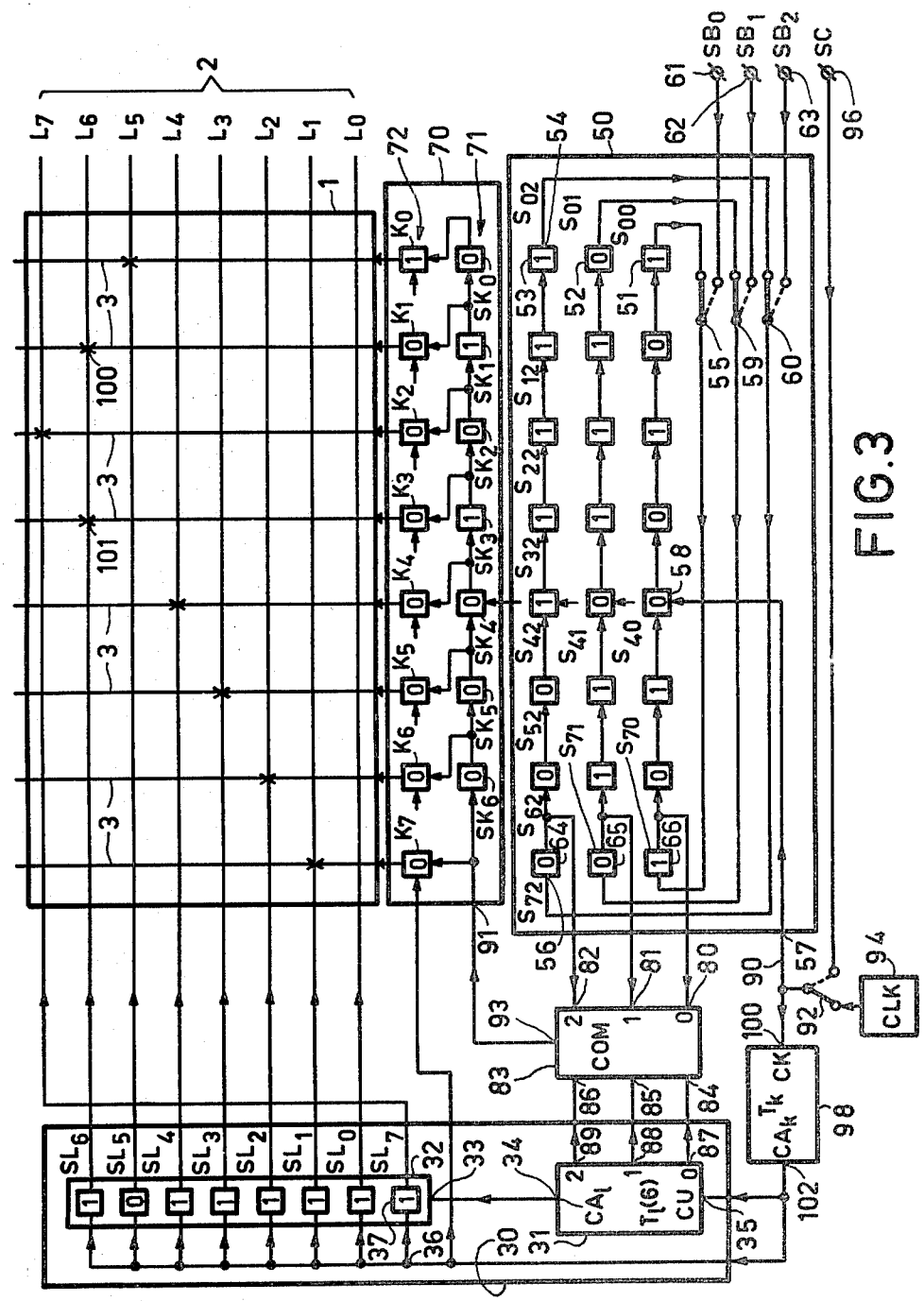
FIG. 3 shows a simplified block diagram of a matrix excitation circuit having a shift register-buffer store.

FIG. 3 shows a matrix excitation arrangement having a row selection circuit 30, a buffer store 50 and a column excitation circuit 70.

For clarity l=k=8 has been chosen in this example but in general much higher values will be used for l and k, often equal to or nearly equal to higher powers of 2, e.g. l=127 and k=256 or similar. The circuits shown by way of example then should be correspondingly expanded.

The arrangement is controlled by a central clock signal CK at the conductor 90, coming from a fixed clock oscillator 94 (CLK) or a samplingclock input 96 (SC) through a selection switch 92.

A secondary clock signal $CA_k$ is derived from CK by frequency division by means of a k-position counter 98 ($T_k$), in this example a 8-position counter which runs cyclically through the positions "0" to "7" inclusive (000 to 111 inclusive) in response to successive pulses CK. The clock signal CK is applied to a counter input 100, the output signal appears at a carry output 102 of the counter 98. A binary counting circuit having a structure as that of a Signetics 54193 counting circuit (see Philips Data Handbook Logic-TTL 1978, page 340) can be used for the counter.

In this example the row selection circuit comprises a row counter 31 ($T_l$) having l possible positions, so a 8-position counter is provided in this example. A similar type as for $T_k$ can be used for the counter 31. In addition, the row selection circuit comprises an l-bit shift register 32, having 8 bits in this example, and output $SL_0$ to $SL_7$ inclusive, each being coupled to the corresponding first excitation electrodes $L_0$ to $L_7$ inclusive. An input 33 of the shift register 32 is connected to a carry output 34 ($CA_l$) of the counter 31. The counter input 35 ("count-up "CU) and the clock input 36 of the shift register 32 are connected together to the output 102 of the k-position counter 98. Generally, the counter output 34 is high ("1"), so that at the end of the clock signal a ("1") which shifts forward at each next clock pulse, is applied to the first bit of the shift register 37. Only at the end of the counting position 111 $CA_l$ becomes "0" and thereafter $SL_7$ becomes "0", which value also shifts forwards thereafter.

$SL_7$="0" during the counting position 000 and consequently $L_7$ receives a down-going pulse during that time. $SL_0$ is equal to "0" during the counting position 001 etc. In the Figure it is assumed that the counter is in the position 110 ("6"), so during this period of time $SL_5$ is "0" and all other $SL_i$="1".

The buffer store 50 comprises n shift register, n following from $2^n \geq 1$.

In the chosen example three shift registers are sufficient for 8 lines, each shift register having a length of 8 bits. In each time three corresponding bits, one from each one of the three shift registers, the amplitude, found when a sample was taken, is present in digital form, so that a total of 8 amplitudes is stored. In the situation shown in the drawing the content of the elements 51, 52, 53 represents by means of the binary number 5 the amplitude of the sample $M_0$, likewise the samples $M_q$ (q=1 ... 7) are found in the bits denoted by $S_{q,0}$ to $S_{q,2}$ inclusive.

An output 54 of a shift register 53 is fed back to the input 56 of that shift register 64 via a switch 60. All shift registers of the buffer store shift the contents forward on the command of the clock signal at the clock input 57 of the buffer store. For clarity the clock signal is shown for the shift register bit 58 ($S_{40}$) only, but it actually controls all bits simultaneously, so that all sample values circulate clock-wise.

Since the counter 98 is a 8-position counter, the entire content circulates exactly once during each separate counting position of the counter 31.

New amplitude values can be applied to the shift registers by switching the switches 55, 59, 60 and 92. Consecutive amplitude representations of the sample buffer inputs 61, 62 and 63 can now be taken over in the shift registers at consecutive pulses of the sampling clock 96. To this end the sample buffer inputs are, for example, coupled to corresponding outputs of an analog-to-digital converter, not shown. After a cycle of, in this case, 8 sample clock pulses the digital value of the first sample $M_0$ has arrived in the bit positions $S_{0,i}$ and the digital value of the eighth sample $M_7$ in the bit positions $S_{7,i}$ (i=0, 1 or 2). Thereafter the switches are switched to their original position until a next sample is taken.

The outputs 64, 65, 66 of the extreme left-hand bits of the three shift registers, $S_{72}$ and $S_{71}$, and $S_{70}$, respectively, constitute the read outputs of the buffer store.

The outputs 64, 65 and 66 of the buffer store are connected to corresponding first inputs 82, 81 and 80, respectively, of a comparison circuit 83 whose second inputs 86, 85 and 84 are connected to corresponding outputs 89, 88 and 87, respectively, of the row counter 31. A comparison output 93 of the comparison circuit 83 is connected to a signal input 91 of the column excitation circuit 70.

One complete 8-positions shift of the buffer store shift registers is of the same duration as 8 clock pulse periods of the clock signal CK at the conductor 90 and, consequently, of the same duration as one counting position of the row 31. All eight samples stored in digital form in the buffer store arrive sequentially at the elements $S_{70}$, $S_{71}$ and $S_{72}$ having the outputs 66, 65 and 64, respectively.

As soon as the number then displayed is equal to the position of the row counter 31 (in this case the position "6") a "1" appears at the comparison output 93 of the comparison circuit. In the case shown in the drawing this occurs after the second and the fourth clock pulse, respectively, of the complete shift.

The column excitation circuit is formed by means of a column shift register 71 ($SK_0$ to $SK_6$ inclusive) and number of column buffer flipflops 72 ($K_0$ to $K_7$ inclusive).

The input 91 of the column excitation circuit 70 is also the signal input of the column shift register 71 at the bit $SK_6$.

At the beginning of the shift the comparison output 93 is "0" so that $SK_6$ becomes "0" at the first of the eight clock pulses of the complete shift. An "0" is also applied at the second clock pulse so that ($SK_7$=) $SK_6$="0", a "6" now appears simultaneously at the inputs 80, 81 and 82 of the comparison circuit 83 so that an "1" is applied to $SK_7$ at the third clock pulse and $SK_6$=$SK_5$="0". After the eighth clock pulse the column shift register 71 is in the position shown in the drawing, the "1" corresponding to the second sample has been entered into the bit $SK_1$, the SK "1" corresponding to the fourth sample has been entered in $SK_3$ and the other bits SK are "0", which also applies to the output 93 of the comparison circuit.

These "0" and "1" values are transferred to the corresponding column buffer flipflops 72 at the eighth clock pulse, which coincides with the carry pulse $CA_k$ of the counter 98 at its output 102. The column excitation circuit shows these flipflops as still having the content 1000 0000 of the preceding shift, just prior to the changeous to 0101 0000. This changeous is completed at the end of the position "6" of the row counter 31. At the next clock pulse the row counter is moved to the position "7", $SL_6$ in the row shift register becomes a "0" so that during the next shift the row $L_6$ and the columns $K_1$ and $K_3$ are simultaneously excited for switching the display elements 100 and 101, respectively, each representing the amplitude "6", to the ON condition. In this manner all amplitude values are sequentially shown with an increasing value in consecutive shifts of the buffer store. If so desired left and right may be interchanged in the display screen.

Figure 4:
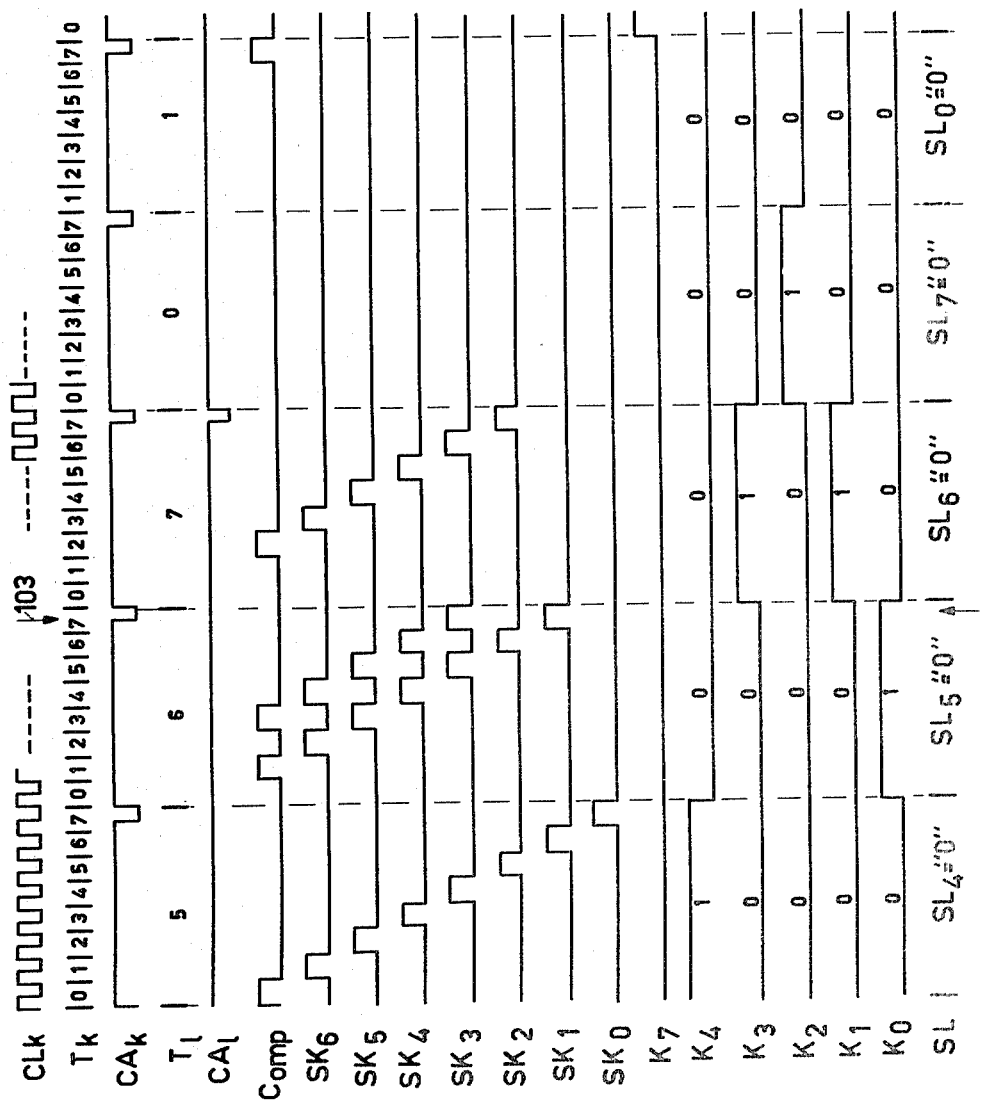
FIG. 4 shows a time diagram associated with a circuit as shown in FIG. 3.

FIG. 4 explains the sequence of events during the display by means of a time diagram of a number of signals, the indication of these signals at the lefthand side of the Figure corresponding to the signal indications in FIG. 3.

The arrow 103 denotes the instant which corresponds to the bit condition shown in FIG. 3.

The shift registers may consist of one or more registers of the Signetics 8273 type, a 10-bit shift register, or a large integrated circuit of a similar implementation (see the above-mentioned handbook, page 573). However, many other types can also be used, occasional adaptations being within the scope of one skilled in the art.

Generally the buffer store will be filled by sampling the output of a suitable analog-to-digital converter in time, the amplitude of the phenomenon to be displayed being classed by comparing it with a number of fixed reference amplitudes. If the amplitude is below the lowest reference amplitude the output code of the analog-to-digital converter is "0" even if the measured amplitude is more than the width of one class below the lowest reference amplitude. For that reason the output "0" is somewhat indeterminate, so that it may be desirable either to shield the first excitation electrode $L_0$ from visual observation or to omit it completely. This applies particularly to the so-called stackable analog-to-digital converters wherein a larger amplitude range can be covered and/or a greater resolution achieved by stacking two or more converters, using many more reference amplitudes. Namely, such converters will produce the code "0" also when the highest reference voltage is exceeded, which code would then also result in a picture element on the row $L_0$.

Figure 5:
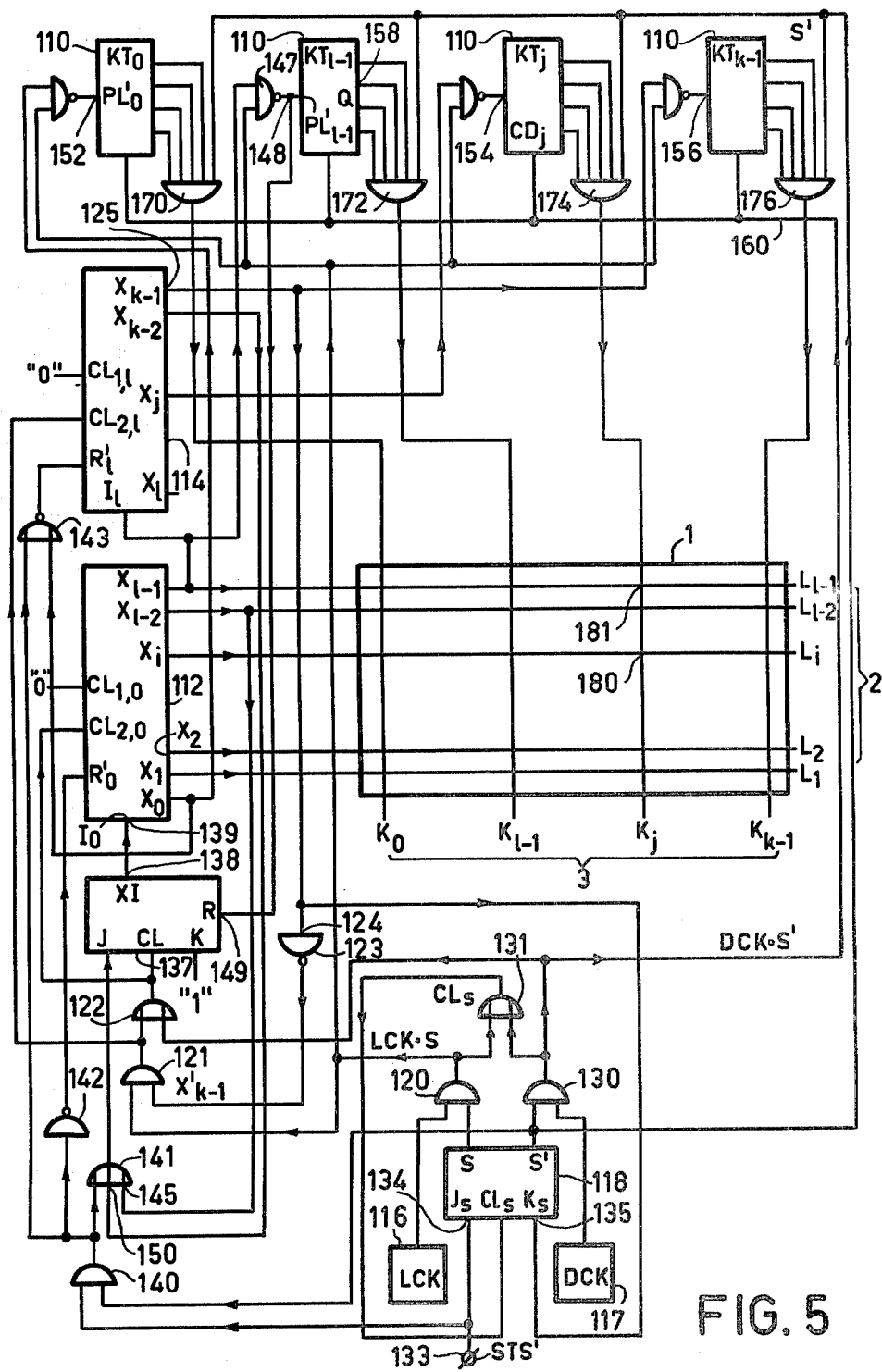
FIG. 5 shows a simplified block diagram of a matrix excitation circuit having column-counter circuits as a buffer store.

In the next embodiment as shown in FIG. 5, a display screen 1 is schematically shown by way of example from which the row $L_0$ has been omitted. This Figure shows $1-1$ rows 2, $L_1$ to $L_{l-1}$ inclusive, and k columns 3, $K_0$ to $K_{k-1}$ inclusive, it being assumed for this example that $k>1$.

Figure 6:
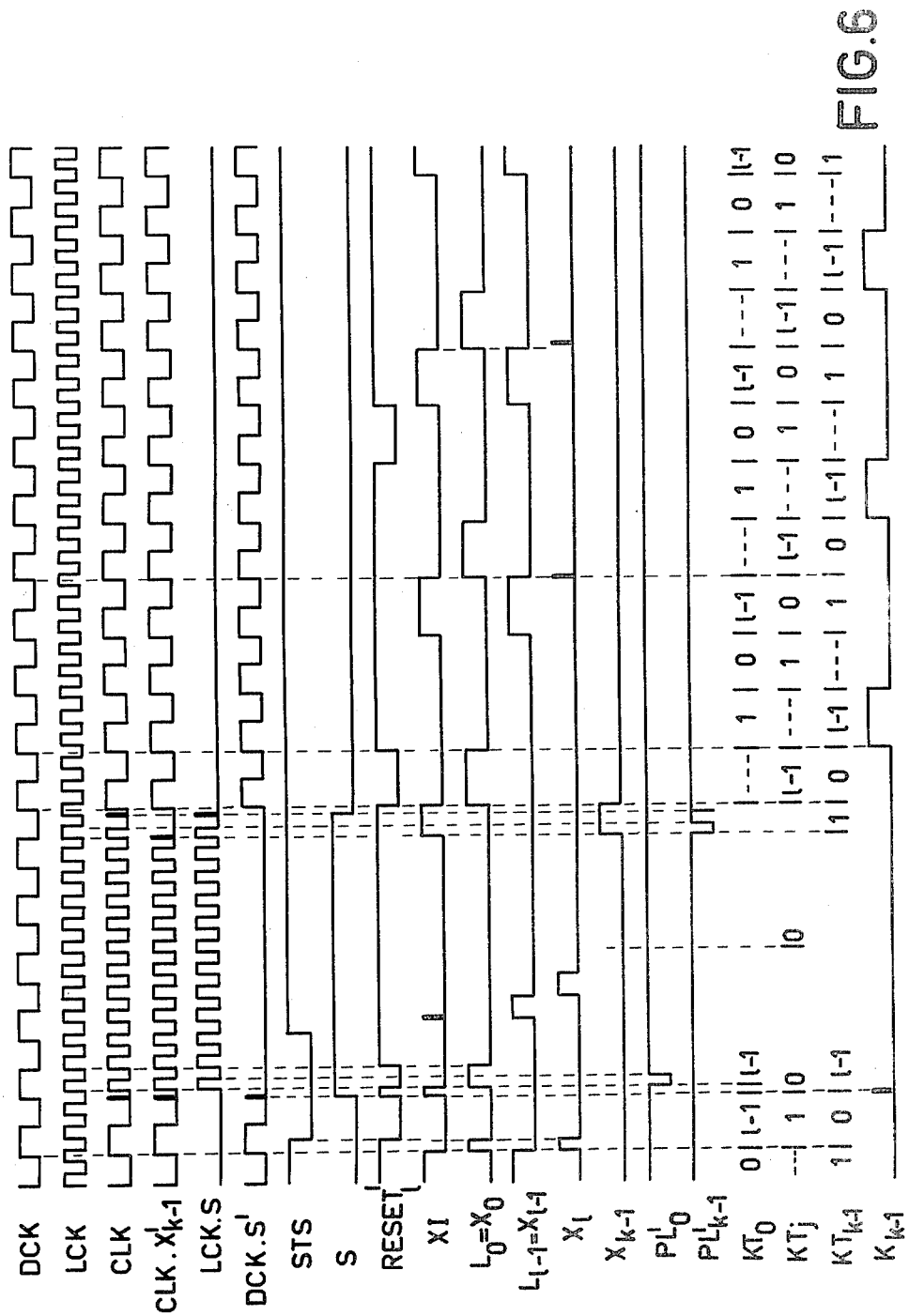
FIG. 6 shows a time diagram associated with a circuit as shown in FIG. 5.

Associated with the description of FIG. 5 is the time diagram of FIG. 6, which does not only include the display period but also the sampling period.

In the circuit shown in FIG. 5 the buffer store is constituted by a number of column counters 110, which number is equal to the number of columns if only one picture element need to be displayed per column, $KT_0$ to $KT_{k-1}$ inclusive. During sampling these column counters can be sequentially loaded, controlled by a column shift register 112, 114. This column shift register itself is excited by a load clock signal LCK produced by a load clock oscillator 116 in the position $S="1"$ of a load selection flipflop 118 via the gate circuits 120, 121 and 122. A complete load cycle comprises k pulses LCK. At the end of the cycle, in which bit $X_{k-1}=1$, the shift register must not be emptied by further shift operations for which purpose the gate 121 is blocked in that position by the signal $X'_{k-1}$, produced by an inverting circuit 123 having an input 124 connected to an output 125 of the bit $X_{k-1}$.

Prior to the start of the loading procedure the flipflop 118 is normally in the position $S="0"$ and $S'="1"$ and this flipflop can then change state by means of an edge of the display clock oscillator 117 via the AND-gate 130 and the OR-gate 131 while the AND-gate 120 is blocked by $S="0"$. If via the starting pulse input 133 a starting pulse STS' (going "low") is applied to the $J_s$-input 134 of the flipflop 118, the latter will arrive in the "1"-position at the next clock pulse edge. The $K_s$-input 135 is connected to the $X_{k-1}$ output 125 and is therefore "0". In this example it is assumed that flipflops, shift registers and counters change state on receipt of a rising edge. If other types are selected corresponding adaptations are a matter of course. A Signetics 54109 is inter alia suitable for use as the flipflop (see the above-mentioned Handbook, page 176), the previously mentioned types 8273 and 54193, respectively, are, for example, suitable for use as the shift registers and counters.

As soon as $S="1"$, S can be reset on receipt of the load clock pulse LCK provided $K_s="1"$. This occurs at a rising edge of the LCK pulse as soon as $X_{k-1}$ is "1" that is as soon as a "1" has been shifted through the entire register.

The first "1" is applied to the shift register from the read flipflop 137, an output 138 (XI) of which is connected to the input 139 of the shift register. This flipflop has been reset to the "0" conditions with $J="1"$, $K="1"$ because the starting signal STS' was given while $S="0"$ and so $S'="1"$ through the AND-gate 140 and the OR-gate 141. At the next clock pulse CLK this "1" is taken over in the first bit of the shift register whereas XI is reset as it still holds for the flipflop 137 that $J="1"$, $K="1"$. As simultaneously S becomes "1", J thereby changes to "0" and K to "1", so that further clock pulses keep the flipflop in the "0" position.

The shift register was previously reset to "0" via an inverting circuit 142 and a NOR-gate 143, respectively. This zero setting is usually superfluous during normal operation but necessary when the excitation circuit has been switched-on for the first time.

As soon as the shift register is in the position $X_{l-2}=1$, the flipflop XI is read at the end thereof via the input 145 of the OR-gate 141. During the loading procedure this is unwanted as now an "1" threatens to be applied again to $X_0$ at the end of the position $X_{l-1}="1"$, that is to say at the next clock pulse. However, prior to that, at the beginning of position $X_{l-1}="1"$, the NAND-gate 147 is excited together with LCK.S so that the signal $PL'_{l-1}="0"$ is produced at the output 148. This output 148 is connected to the resetting input 149 of the flipflop 137 so that it is immediately reset after its "1"-condition is produced. So no further "1" is applied to the shift register.

Finally, owing to the input 150 of the OR-gate 141, J becomes "1" during the position $X_{k-2}="1"$ of the shift register so that XI becomes "1" at the end of this position, this position being retained during $X_{k-1}="1"$, so that a new "1" is applied to $X_0$ at the occurrence of the clock pulse at the end of $X_{k-1}="1"$.

During this complete cycle of the shift register from $X_0="1"$ to $X_{k-1}="1"$ inclusive the load inputs 152, 148, 154, 156 of the column-counter circuits 110 are sequentially excited via the input NAND-gates 147 etc. During each first half of a shift register position LCK="1" and so, with S="1", also LCK.S="1"; so LCK.S="1" and $X_j$="1" results for the duration of half a clock period in $PL'_j$="0". This is the load command for the counting circuits used here.

For clarity, the load inputs for the data are not shown in the drawing but it will be clear that the output value of the analog-to-digital converter is carried over to the counting circuit $KT_j$ when $X_j$="1".

These counters do not count during the load procedure, the resetting inputs $CD_j$ (160) are blocked in response to S'="0" and, consequently, DCK.S'="0".

So at the end of the loading procedure all counting circuits $KT_j$ are loaded with the output values of the analog-to-digital converter found at the successive LCK load clock pulses. It will be clear that during this sample and hold period, LCK also performs the function of the oscilloscope time base.

As during $X_{k-1}$="1" the flipflop S is reset to the "0" position and the load period is terminated. The shift register does not shift at this last positive going LCK edge because $X'_{k-1}$="0", which blocks the shift register clock for the portion $X_l$ to $X_{k-1}$ inclusive, because $CL_{2,l}$=LCK.S.$X'_{k-1}$.

However, the first portion shifts at the next edge of DCK as soon as S'="1", because $CL_{2,0}$=LCK.S.$X'_{k-1}$+DCK.S'. $X_0$ becomes "1", causing the second portion of the shift register to be reset via the NOR-gate 143, so that $X_{k-1}$="0".

This is the start of the display period. During the display period S remains equal to "0" and S'="1" so that no clock pulses are applied during the second portion of the shift register as $CL_{2,l}$=LCK.S.$X'_{k-1}$="0".

However, the first portion $X_0$ to $X_{l-1}$, inclusive, does shift forward as $CL_{2,0}$=DCK.S'(+LCK.$X'_{k-1}$) wherein the second term is "0" in response to S="0".

The XI flipflop 137 was moved to the "1" position at the end of the load period so that a "1" is set in $X_0$ at the first rising edge of DCK.S'. XI is reset at the same edge so that at the next edges $X_0$ becomes invariably "0", the "1" shifting forward to $X_1$, $X_2$, etc. until $X_{l-2}$="1". As described above, at the end of the position $X_{l-2}$="1", the flipflop 137 is set to the "1" position via the input 145 of the OR-gate 141. However, this position is retained during the position $X_{l-1}$="1", so that at the end of the position $X_{l-1}$="1" a "1" is circulated to $X_0$. This cycle keeps running as long as S'="1", that is to say as long as no new signal start loading STS' is given. As the outputs $X_1$ to $X_{l-1}$ are connected to the corresponding first excitation electrodes $L_1$ to $L_{l-1}$, inclusive, these first excitation electrodes are excited cyclically and sequentially.

Simultaneously, the clock signal DCK.S' is now applied to the common clock input 160 of all column counting circuits, so that these circuits start counting down one position at each rising edge.

A counter, loaded with the content i will then sequentially cycle through the values i−1, i−2, ... 1,0, 1−1, 1−2, ... i+1, i etc.

The column counters excite the column excitation circuit formed by means of an AND-gate for each of the column counters $KT_j$, 170, 172, 174, 176, etc. The outputs of these AND-gates are connected to the k corresponding second excitation electrodes 3, $K_0$ to $K_{k-1}$, inclusive.

In the case l is a power of two, the highest attainable position of a counter $KT_j$ is therefore $1-1=2^{m-1}$ for a m-bit counter having outputs $Q_0$ to $Q_{m-1}$(158), inclusive, which are connected to m corresponding inputs of an associated AND-gate, 172 and others. A further input of all AND-gates is connected to the output S' of the flipflop 118.

So, as soon as counter $KT_j$ arrives in the position 1−1, the output of the associated AND-gate becomes "1" and, consequently, the second excitation electrode is excited, during the display period where S'="1" and all $Q_0$="1" to $Q_{m-1}$="1" inclusive.

Let us assume that a counter $KT_j$ was loaded with the value "0000" (when, for example, m=4, l=16), this counter will count down, at the first clock pulse of the display period, in the position "1111" and the second excitation electrode $K_j$ will be excited during the period of time in which $X_0$ is "1". As the first excitation electrode $L_0$ is missing, no display element of this column will be excited, which is the desired situation as described above.

Let us assume, however, that the counter $KT_j$ was loaded with the value i≠0, then the counter $KT_j$ does not arrive in the position 1−1 until after i+1 clock pulses, so that the second excitation electrode $KT_j$ is excited from the i+$1^{st}$ clock pulse onwards until the i+$2^{nd}$ clock pulse of the display cycle. This is exactly the period of time during which $X_j$="1" and so the period of time in which the first excitation electrode $L_i$ is excited.

The display element 180 is now driven to the ON-state.

In the case i=1−1 the excitation coincides with that of $L_{l-1}$ and then the display element in 181 would have been driven to the ON-state.

So the "height" of the excited element invariably corresponds to the amplitude of the sample $M_j$ which was loaded at the instant $X_j$="1" as the value $i_j$ into the counter $KT_j$ via the analog-to-digital converter, so that the control of the liquid crystal is performed exactly in accordance with the description in the preamble of the description.

It will be clear that the implementation can be varied in many ways without deviating from the same principle. Thus, it is, for example, possible to load the counters with the inverse code of the analog-to-digital converter, that is to say with the value 1−1−i, then having the counters counting up instead of down. Alternatively it is possible to load the counters with i and to have them count up nevertheless. The desired result now appears upside down on the display screen. This can be corrected by now connecting the first excitation electrodes from top to bottom instead of from bottom to top, as shown in FIG. 5.

It holds in all cases that in view of the root-mean-square behaviour of the liquid crystal a number of display cycles must always follow a load cycle, for example for at least approximately 10 cycles. In view of the time constant of the liquid crystal the frequency is preferably chosen at at least 10 display cycles per second.

So, in the example of FIG. 3 a frequency of ≧10 Hz is required for $CA_l$ at output 34 of counter 31, consequently a frequency of ≧10.l Hz for $CA_k$ at the output 102 of the counter 98 and a frequency of ≧10.k.l Hz for the display clock frequency of the clock oscillator 94.

In the example of FIG. 5 a frequency of ≧10 Hz is required for XI at the output 138 of the flipflop 137 and a frequency ≧10.l Hz for the clock input $Cl_{2,0}$ of the shift register 112 during the display period and so this same frequency ≧10.1 Hz for the DCK display oscillator 117.

In both these examples a next loading operation may start at any instant in a display cycle, so the sampling period need not be in synchronism with the display cycle. This means that a loading operation can start immediately after, for example, a so-called "trigger" signal of the oscilloscope.

Generally the required shift registers, counters, flip-flops and gates will be combined in one or more so-called Large Scale Integrated circuits (LSI-circuits), a simple structure being usually more important than minimizing the number of integrated elements. In that case it may be preferred, in the example of FIG. 5, not to combine the shift registers for row excitation and column loading but to use two separate shift registers of l and k bits, respectively. The control by means of clock- and reset-signals is then simplified.

Finally, it should be noted that it was assumed for FIG. 5 that k>1. Should, however, k≦1 then the shift register 114 can be omitted completely and the shift register 112 keeps the length l. The control signals for the loading cycle must then be adapted correspondingly, which will be an easy task for one skilled in the art.

What is claimed is:

1. A matrix excitation circuit for an oscilloscope display screen comprising a root-mean-square type of liquid crystal, a plurality of first line-shaped electrodes extending in a first direction at one side of said liquid crystal, a plurality of second line-shaped electrodes extending in a second direction at an opposite side of said liquid crystal, said first direction crossing said second direction, a row selection circuit for sequentially and cyclically exciting each of said first electrodes, and a column excitation circuit for simultaneously exciting said second electrodes with a plurality of excitation pulses to form an image in said liquid crystal display elements between first and second electrodes, wherein a buffer store for storing information to be displayed is provided with address inputs coupled to outputs of said row selection circuit for reading information in synchronism with row selection and read outputs coupled to said column excitation circuit for generating column excitation pulses.

2. A matrix excitation circuit according to claim 1, wherein said buffer store comprises at least two storage positions for each second electrode for simultaneously displaying at least two phenomena on said oscilloscope display screen.

3. A matrix excitation circuit according to claim 2, wherein said row selection circuit includes a shift register having a number of elements at least equal to the number of said first electrodes, and a line counting circuit having consecutive counting positions corresponding to consecutively selected first electrodes, and wherein an outlet of an element of said shift register is coupled to a corresponding first electrode and said shift register shifts a signal having a bit length of one for sequentially exciting said first electrode.

4. A matrix excitation circuit according to claim 3, wherein said column excitation circuit includes a column selection circuit and a comparison circuit having a group of first inputs coupled to said read outputs of said buffer store and having a group of second inputs coupled to outputs of said line counting circuit, a comparison output being coupled to said column selection circuit for applying an excitation pulse to a second electrode when the content of said buffer store corresponding to said second electrode equals the position of said line counting circuit.

5. A matrix excitation circuit according to claim 4, wherein said buffer store is formed by at least one buffer shift register.

6. A matrix excitation circuit according to claim 1, wherein said row selection circuit includes a shift register having a number of elements at least equal to the number of said first electrodes, and a line counting circuit having consecutive counting positions corresponding to consecutively selected first electrodes, and wherein an outlet of an element of said shift register is coupled to a corresponding first electrode and said shift register shifts a signal having a bit length of one for sequentially exciting said first electrodes.

7. A matrix excitation circuit according to claim 6, wherein said column excitation circuit includes a column selection circuit and a comparison circuit having a group of first inputs coupled to said read outputs of said buffer store and having a group of second inputs coupled to outputs of said line counting circuit, a comparison output being coupled to said column selection circuit for applying an excitation pulse to a second electrode when the content of said buffer store corresponding to said second electrode equals the position of said line counting circuit.

8. A matrix excitation circuit according to claim 1, wherein said buffer store is formed by at least one buffer shift register.

9. A matrix excitation circuit for an oscilloscope display screen comprising a root-mean-square type of liquid crystal, a plurality of first line-shaped electrodes extending in a first direction at one side of said liquid crystal, a plurality of second line-shaped electrodes extending in a second direction at an opposite side of said liquid crystal, said first direction crossing said second direction, a row selection circuit for sequentially and cyclically exciting each of said first electrodes, and a column excitation circuit for simultaneously exciting said second electrodes with a plurality of excitation pulses to form an image in said liquid crystal display elements between first and second electrodes, wherein a buffer store for storing information to be displayed is included, said buffer store being implemented with at least one column counting circuit for every second electrode, each of said column counting circuits including a counting pulse input, a load pulse input, a plurality of data inputs and a plurality of counting outputs, and wherein corresponding data inputs of all column counting circuits are mutually interconnected to conductors forming writing inputs of said buffer store, said counting outputs being coupled to said column excitation circuit.

10. A matrix excitation circuit according to claim 9, wherein a column shift register is included having a number of elements equal to the number of said column counting circuits for sequentially exciting said load pulse inputs of said column counting circuits.

11. A matrix excitation circuit according to claim 10, wherein said row selection circuit includes a row shift register having a number of elements at least equal to the number of said first electrodes for sequentially exciting said first electrodes.

12. A matrix excitation circuit according to claim 11, wherein said column shift register and said row shift register are combined into a single shift register.

13. A matrix excitation circuit according to claim 9, wherein said row selection circuit includes a row shift register having a number of elements at least equal to the number of said first electrodes for sequentially exciting said first electrodes.

14. A matrix excitation circuit according to claim 1, wherein said column excitation circuit and said row selection circuit produce pulses having the same amplitude and an opposite polarity.

15. A matrix excitation circuit according to claim 9, wherein said excitation circuit and said row selection circuit produce pulses having the same amplitude and an opposite polarity.

* * * * *